United States Patent
Hynecek

(10) Patent No.: US 8,802,472 B2
(45) Date of Patent: Aug. 12, 2014

(54) SMALL PIXEL FOR IMAGE SENSORS WITH JFET AND VERTICALLY INTEGRATED RESET DIODE

(75) Inventor: Jaroslav Hynecek, Allen, TX (US)

(73) Assignee: Intellectual Ventures II LLC, Wilmington, DE (US)

( * ) Notice: Subject to any disclaimer, the term of this patent is extended or adjusted under 35 U.S.C. 154(b) by 0 days.

(21) Appl. No.: 13/563,237

(22) Filed: Jul. 31, 2012

(65) Prior Publication Data

US 2013/0026345 A1   Jan. 31, 2013

Related U.S. Application Data

(62) Division of application No. 12/153,140, filed on May 14, 2008, now Pat. No. 8,242,546.

(30) Foreign Application Priority Data

May 14, 2007   (KR) .................. 10-2007-0046617

(51) Int. Cl.
    *H01L 31/00*   (2006.01)
    *H01L 27/146*   (2006.01)
(52) U.S. Cl.
    CPC ...... *H01L 27/1463* (2013.01); *H01L 27/14603* (2013.01); *H01L 27/14609* (2013.01)
    USPC .............................. 438/48; 257/292; 257/461
(58) Field of Classification Search
    CPC ................................................. H01L 27/14609
    USPC ..................................... 438/48; 257/292, 461
    See application file for complete search history.

(56) References Cited

U.S. PATENT DOCUMENTS

| 5,625,210 A | 4/1997 | Lee et al. |
| 5,786,615 A | 7/1998 | Saito |
| 5,881,184 A | 3/1999 | Guidash |
| 5,904,493 A | 5/1999 | Lee et al. |
| 6,797,935 B2 | 9/2004 | Kaya et al. |
| 7,176,462 B2 | 2/2007 | Mabuchi |
| 7,417,268 B2 | 8/2008 | Cazaux et al. |

(Continued)

FOREIGN PATENT DOCUMENTS

| KR | 1020040065963 | 7/2004 |
| KR | 1020070108010 | 11/2007 |

OTHER PUBLICATIONS

Takahashi, Hidekazu, et al., "A 1/2.7 inch Low-Noise CMOS Image Sensor for FUII HD Camcorders," ISSCC 2007 Digest of Technical Papers, pp. 510-511.

*Primary Examiner* — Howard Weiss
*Assistant Examiner* — Tifney Skyles
(74) *Attorney, Agent, or Firm* — McAndrews, Held & Malloy, Ltd.

(57) ABSTRACT

A pixel and a pixel array of an image sensor device of the present invention have small pixel sizes by resetting sensed charge using a diode built vertically above a substrate. The pixel and the pixel array also have low noise performance by using a JFET as a source follower transistor for sensing charge. The pixel includes a floating diffusion node configured to sense photo-generated charge, a reset diode configured to reset the floating diffusion node in response to a reset signal, and a junction field effect transistor configured to output a signal having an output voltage level corresponding to a charge level of the floating diffusion node.

19 Claims, 5 Drawing Sheets

(56) References Cited

U.S. PATENT DOCUMENTS

| | | |
|---|---|---|
| 7,723,140 B2 * | 5/2010 | Rhodes .......................... 438/48 |
| 7,928,484 B2 | 4/2011 | Hynecek |
| 2004/0036789 A1 | 2/2004 | Shinohara |
| 2005/0087784 A1 | 4/2005 | Lee et al. |
| 2007/0007559 A1 | 1/2007 | Lee et al. |
| 2007/0257286 A1 | 11/2007 | Hynecek |
| 2008/0258182 A1 | 10/2008 | Agarwal et al. |

\* cited by examiner

SMALL PIXEL FOR IMAGE SENSORS WITH JFET AND VERTICALLY INTEGRATED RESET DIODE

CROSS-REFERENCE(S) TO RELATED APPLICATIONS

The present application is a divisional of U.S. Ser. No. 12/153,140, filed May 14, 2008, which claims priority to Korean patent application number 10-2007-0046617, filed on May 14, 2007, both of which are incorporated by reference in their entireties.

BACKGROUND OF THE INVENTION

The present invention relates to solid-state image sensors, specifically to Complementary Metal-Oxide-Semiconductor (CMOS) image sensors that have very small pixel sizes. In more particular the present invention relates to pixels that use only two transistors (2T) and a diode for the reset and addressing instead of the typical reset and addressing transistors. Furthermore the diode can be built vertically on top of the silicon substrate and have a very small size in order not to occupy the valuable pixel area. A Source Follower (SF) MOS transistor for sensing charge has been replaced in this pixel by a depletion mode n-channel Junction gate Field-Effect Transistor (JFET), which gives the pixel very low noise performance. The described pixel is still capable of standard low noise correlated double sampling (CDS) operation as is typically used with 4T pixel architectures. This further contributes to the pixel high performance with high conversion gain and maximum optical symmetry.

The typical image sensors sense light by converting impinging photons into electrons that are integrated (collected) in sensor pixels. After completion of integration cycle collected charge is converted into a voltage, which is supplied to the output terminals of the sensor. In typical CMOS image sensors the charge to voltage conversion is accomplished directly in the pixels themselves and the converted analog pixel voltage is transferred to the output terminals through various pixel addressing and scanning schemes. The analog signal can also be converted on-chip to a digital equivalent before reaching the chip output. The pixels have incorporated in them a buffer amplifier, typically a source follower, which drives sense lines that are connected to the pixels by suitable addressing transistors. After charge to voltage conversion is completed and the resulting signal is transferred out from the pixels, the pixels are reset in order to be ready for accumulation of new charge. In pixels that are using Floating Diffusion (FD) node as a charge detection node, the reset is accomplished by turning on the reset transistor that momentarily conductively connects the FD node to a voltage reference. This step removes charge collected on the FD node; however, it generates kTC-reset noise as is well known in the art. The kTC noise has to be removed from the signal by the CDS signal processing technique in order to achieve desired low noise performance. The typical CMOS sensors that utilize the CDS concept need to have four transistors (4T) in the pixel. An example of the 4T pixel circuit can be found in the U.S. Pat. No. 5,904,493 to Guidash.

Recently a new pixel operating technique has been developed in the literature and in many products. The pixel having three transistors (3T) where the addressing transistor is eliminated is proposed. In the 3T pixel, the pixel addressing is accomplished by the Source Follower (SF) transistor itself through applying a suitable bias on the FD nodes that are not selected. The latest description of this concept can be found for example in the: ISSCC 2007 Digest of Technical Papers, "A 1/2.7 inch Low-Noise CMOS Image Sensor for Full HD Camcorders" pp. 510-511, by Hidekazu Takahashi et al. Eliminating the addressing transistor from the pixel saves the valuable pixel area and also eliminates one control wire that was needed for controlling the addressing transistor gate.

FIG. 1 is a schematic circuit diagram illustrating a conventional 3T pixel. The 3T pixel includes a pinned photo-diode PD and three MOS transistors MT1 to MT3. The photodiode PD is coupled through the first MOS transistor MT1, which is for transferring charge, to a FD node 101. The second MOS transistor MT2, which is a Source Follower (SF) transistor for sensing charge, has its gate connected to the FD node 101, the drain connected to VDD node 102 and the source connected to an output column bus 103: The VDD node 102 is connected to the VDD column bus 104 that is further connected to the drain switch SW. The FD node 101 is reset to VDD node 102 by the third MOS transistor MT3, i.e., a reset transistor. The gate of the third MOS transistor MT3 is controlled by a row bus line 110 and the gate of the second MOS transistor M1 is controlled by a second row bus line 111.

As photons 120 impinge on the photodiode PD, electron charge is generated there. After completion of charge integration the FD node 101 is reset and all charge from the photodiode PD is transferred on the FD node 101. This changes the FD voltage from the original reset level to a new signal level. Both levels, the reset level and signal level on the FD node 101 are then sensed by the second MOS transistor MT2 and both levels are transferred onto the output column bus 103 and further into column signal processing circuits for subtraction and additional processing. The subtraction of the reset level from the signal level is called Correlated Double Sampling (CDS), which removes the kTC noise and the transistor threshold non-uniformities from the signal. In order to prevent interference from signals that are generated on second MOS transistors of pixels in the remaining rows that are not addressed and are connected to the same column, the FD nodes of these pixels are set low. This turns first MOS transistors, i.e., the SF transistors, of these pixels off, since the SF transistor of the selected pixel is biased high.

The advantage of the 3T pixel circuit is that fewer transistors occupy less pixel area and the elimination of the addressing transistor eliminates the gate addressing line, lowers the pixel output impedance and eliminates noise generated in that transistor. However, the three transistors still occupy a significant amount of the valuable active pixel area, which is a problem for further reduction of pixel size and thus for lowering the cost of the CMOS image sensors. This disadvantage is often times compensated by sharing the pixel circuit with several photo diodes. However, the circuit sharing has also its disadvantages. In such circuits the FD node capacitance is increased, which reduces the pixel sensitivity, and interconnection lines also occupy the valuable pixel area. Other disadvantages of the sharing concept are slightly asymmetrical layout and electrical functions that result is some asymmetrical optical as well as electrical cross talk problems. It is therefore desirable to, design a pixel that have very small size to begin with, and that do not sharing of the circuits excessively.

SUMMARY OF THE INVENTION

Embodiments of the present invention are directed to providing a pixel and a pixel array of an image sensor device with small pixel sizes by resetting sensed charge using a diode built vertically above a substrate. It also provides a pixel and a pixel array of an image sensor device with low noise performance by using a JFET as a source follower transistor for sensing charge.

Furthermore, according to the present invention, it is possible to share the pixel circuit even though the sensed charge is reset by the diode built vertically above the substrate. It further provides a method for driving an image sensor, which can maintain the maximum packing density and the full CDS operation capability achieving low noise operation with kTC noise reduction.

In accordance with an aspect of the present invention, there is provided a pixel of an image sensor, which includes a floating diffusion node configured to sense photo-generated charge, a reset diode configured to reset the floating diffusion node in response to a reset signal, and a junction field effect transistor configured to output a signal having an output voltage level corresponding to a charge level of the floating diffusion node.

In accordance with an aspect of the present invention, there is provided a pixel array of an image sensor, which includes multiple pixels each including a floating diffusion node configured to sense photo-generated charge, a reset diode configured to reset the floating diffusion node in response to a reset signal, and a junction field effect transistor configured to output a signal having a voltage level corresponding to a charge level of the floating diffusion node, wherein the pixels are arranged in rows and columns.

In accordance with an aspect of the present invention, there is provided a pixel array of an image sensor, which includes multiple pixels each including a sensing node configured to sense photo-generated charge, a transfer transistor configured to transfer the photo-generated charge from a photodiode to the sensing node in response to a signal from a transfer control signal line, a reset diode coupled between the sensing node and a reset signal line, and a junction field effect transistor configured as a source follower and including a gate coupled to the sensing node, a drain coupled to a first bus line, and a source coupled to a second bus line, wherein the pixels are arranged in rows and columns.

In accordance with an aspect of the present invention, there is provided a method for driving a pixel array which includes a plurality of pixels, which includes switching a power supply voltage level from a low level to a high level and simultaneously activating a reset signal to a low level, activating the reset signal to a predetermined level to reset the corresponding pixel, activating a transfer signal to transfer charge generated in the corresponding pixel, switching the power supply voltage level from the high level to the low level and simultaneously activating the reset signal to a high level.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF PREFERRED EMBODIMENTS

Hereinafter, exemplary embodiments of the present invention will be described in detail with reference to accompanying drawings.

Figure 1:
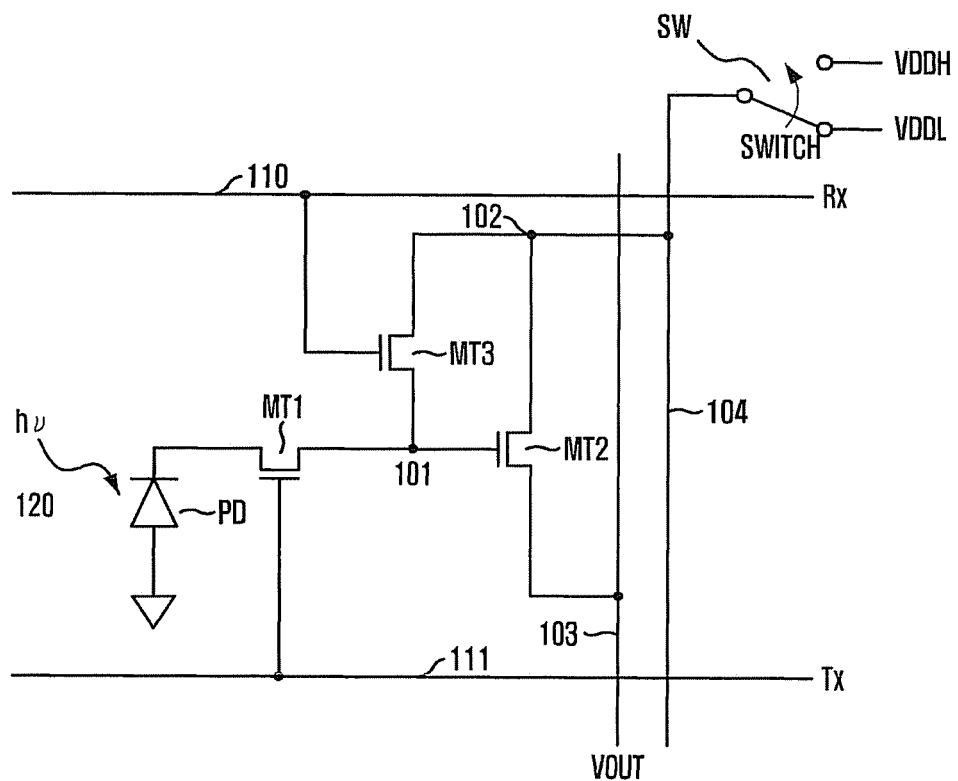
FIG. 1 is a schematic circuit diagram illustrating a conventional 3T CMOS image sensor pixel with a pinned photodiode for sensing light and switched drain bias for addressing.
Figure 2:
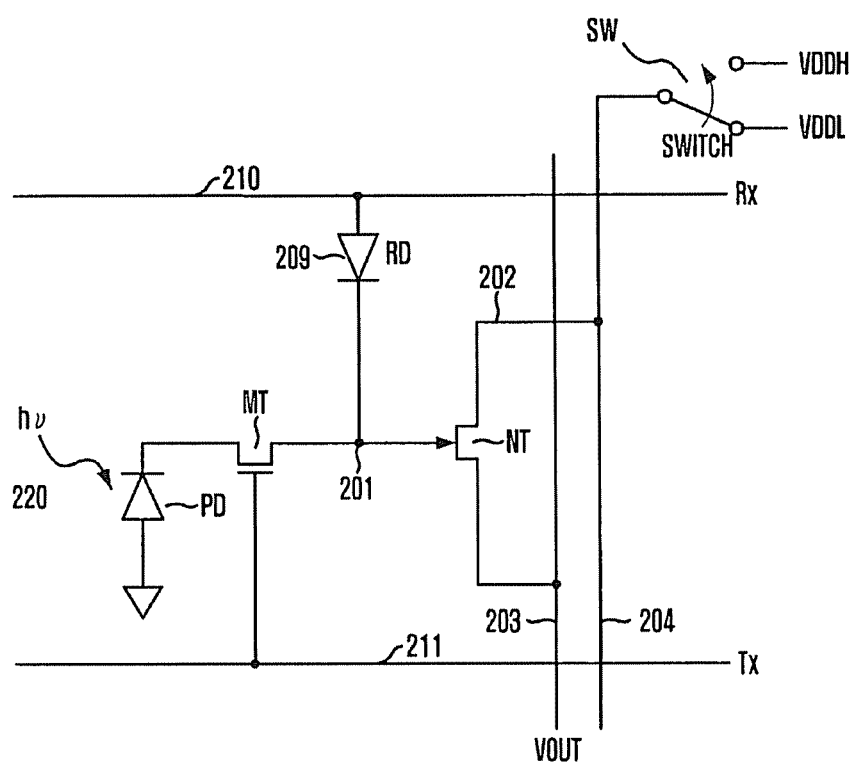
FIG. 2 is a schematic circuit diagram illustrating a 2T CMOS image sensor pixel with a JFET for sensing charge and a reset diode for resetting the sensed charge in accordance with an embodiment of the present invention.

FIG. 2 is a schematic circuit diagram of a pixel in accordance of present invention. The pixel includes a pinned photodiode PD, a MOS transistor MT, an n-channel JFET NT and a p-n diode RD. The pinned photodiode PD is coupled through the MOS transistor MT, i.e., a charge transfer transistor, to a charge detection floating diffusion (FD) node 201. The FD node 201 is reset by the p-n diode RD that is connected to a reset line 210. The voltage on the FD node 201 is sensed by the n-channel JFET NT, i.e., a source follower transistor. The n-channel JFET NT has its gate connected to FD node 201, the source connected to an output column bus line 203, and the drain connected to a drain bus line 204 through a drain node 202. The drain bus line 204 is connected to a drain switch SW that has a capability to switch the drain voltage between two levels VDDH (the high level of the supply voltage) and VDDL (the low level of the supply voltage). Charge generated in the pinned photodiode PD by photons 220 is transferred from the pinned photodiode PD to the FD node 201 by the MOS transistor MT that has its gate connected to a charge transfer control line 211, i.e., a row bus line.

Figure 5:
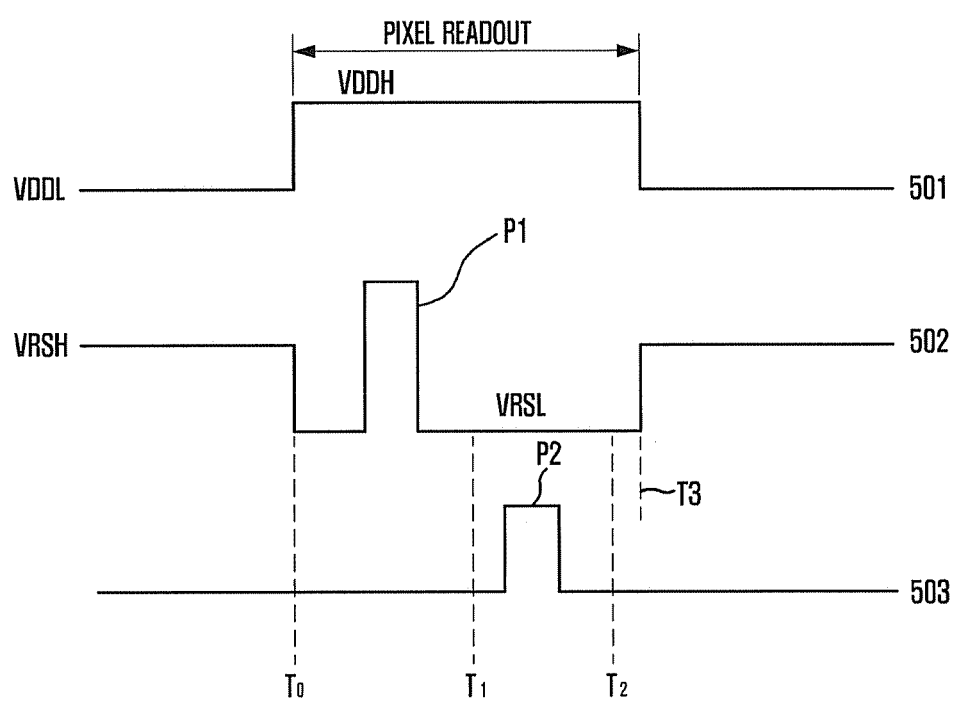
FIG. 5 is a signal timing diagram illustrating operation of the 2T CMOS sensor pixel of FIG. 2 during the cycle of addressing, reset, and sensing operations.

In order to better understand the pixel operation, one embodiment of the signal timing diagram of the pixel is shown in FIG. 5. At the beginning of a pixel readout cycle T0, the drain switch SW is switched from the low level VDDL to the high level VDDH and the bias of the reset line 210 is lowered from a high reset level VRSH to a low reset level VRSL, referring to signals 501 and 502. This operation is important for canceling the capacitive feed through caused by the capacitance of the reversed biased JFET gate-drain junction and thus maintaining the desired bias of the FD nodes for all pixels in the array.

In the next step a reset pulse P1 is applied to the selected reset line 210 which resets the FD node 201 to a suitable voltage level that is needed for charge sensing. This level is controlled by adjusting the amplitude of the reset pulse P1. At the completion of the reset cycle T1, the reset level is sensed at an output node of the Source Follower (SF) JFET NT by a signal processing circuit located at the periphery of the pixel. Thereafter, referring to a signal 503, the charge transfer transistor MT is turned on in response to a pulse P2 and charge from the pinned photodiode PD is transferred on the FD node 201. The FD node voltage is changed in proportion to transferred charge and this voltage level is sensed at the output node of the SF JFET NT again at the time T2. The resulting signal difference is then sensed by the peripheral signal processing circuit that have a capability to eliminate kTC noise or accomplish other signal processing tasks.

During this cycle all the not addressed rows had the same reset level VRSL applied to them except the reset pulse P1 that is applied only to the addressed row, i.e., the selected reset line 210. This scheme thus guarantees that all the not addressed rows, i.e. remaining reset lines, have the FD node biased at the predetermined low level and thus causing the corresponding SF JFET to be turned off. This prevents interference that might occur otherwise from the signals of other pixels that are connected to the same column bus line. The pixel readout cycle is completed at the time T3 when the voltage level supplied to the drain bus line 204 is returned to the original starting level.

The bias on the FD node 201 outside the pixel readout interval is controlled by choosing the suitable bias levels for the levels VDDL and VRSH. The FD node 201 is reset by the p-n diode RD and set again to the low level by gate-drain junction of the SF JFET NT. The small voltage difference between the levels VDDL and VRSH keeps the p-n diode RD and the gate-drain junctions of the SF JFET NT slightly forward biased, which prevents the potential of the FD node 201 from drifting away from the desired low level. The diode forward bias current can be very small, comparable to the diode dark current in order not to unnecessarily increase the image sensor power consumption. The diode may not be required to have a particularly high quality, since the pixel readout time is very short and not much charge can accumulated on the FD node from the diode reverse leakage current during this time. This makes the construction of the diode particularly advantageous, since the simple epitaxial, amorphous silicon, or even poly-silicon deposition processing can be used for its formation.

Figure 3:
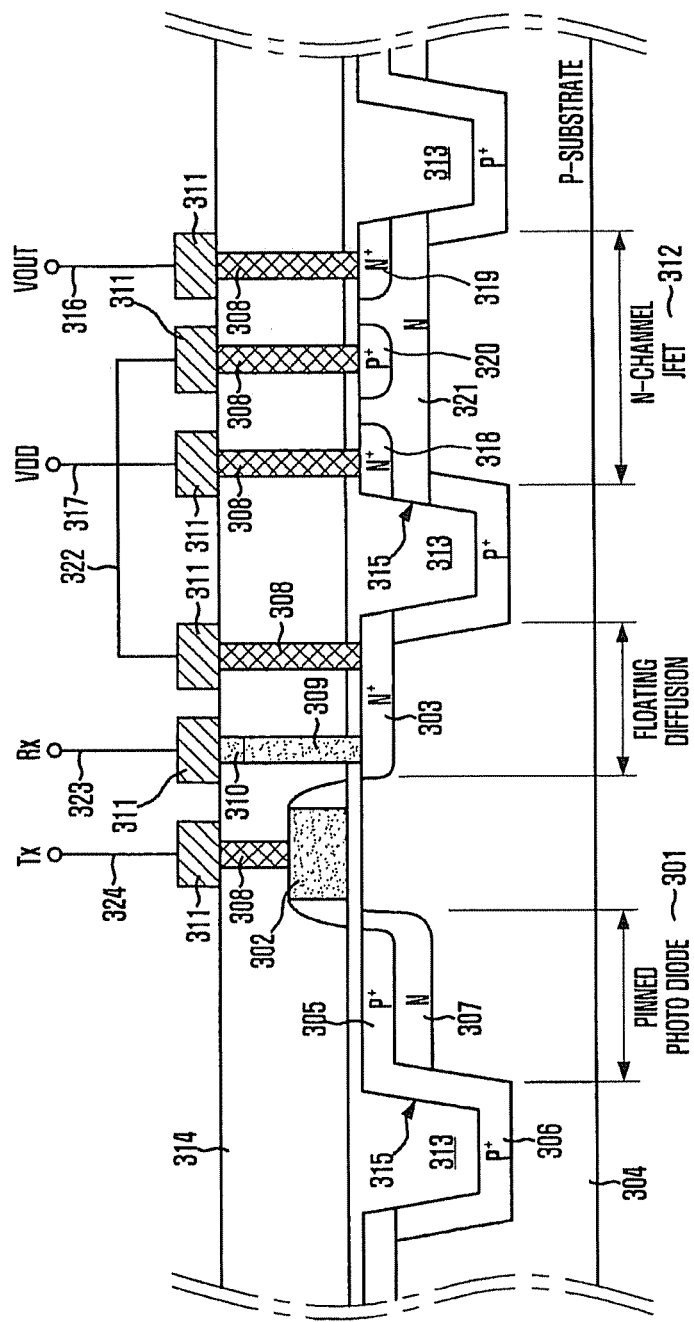
FIG. 3 is a cross section view illustrating the reset diode of the FIG. 2 vertically deposited in a circuit contact region in accordance with an embodiment of the present invention.

FIG. 3 is a cross section view illustrating the portion of the pixel which includes a pinned photodiode region 301, a charge transfer transistor with its poly-silicon gate 302 and an N+ doped FD node 303. The pixel further includes an n-channel JFET region 312 which is formed by a JFET having an N+ source 319, an N+ drain 318, a P+ gate 320 and an n-channel 321. Each element of the JFET is formed as a doped area on a substrate. A pinned photodiode is formed by a P+-type doped layer 305 located close to a silicon surface and a N-type doped layer 307 where the photo-generated charge is stored. The P+-type doped layer 305 extends all the way along the sides of a STI trench 315. The STI trench 315 is filled with the Silicon Dioxide 313 that further extends along the surface of the silicon under the transfer gate 302 of the charge transfer transistor. Another layer of dioxide or other suitable dielectric layer 314 is deposited over the entire structure to provide isolation for metal interconnection layers 311 that provide the necessary connections for the circuit. The metal interconnection layers 311 receive their signal from circuit nodes built into the silicon substrate 304 via holes opened in the dielectric layers 313 and 314. The holes are filled with metal plugs 308. The circuit interconnections are shown only schematically by lines 316 to 324. The interconnection line 324, i.e., the charge transfer control line 211 of FIG. 2, connects the charge transfer gate 302 to a corresponding control signal bus Tx. The interconnection line 323, i.e., the reset line 210 of FIG. 2, connects a p-type reset diode to a corresponding reset control signal bus Rx. The interconnection line 322 is only a local pixel interconnection line that connects the FD node 303 to the gate of the SF JFET 320. The drain of the SF JFET 318 is connected to the column drain bus via the interconnection line 317, i.e., the drain bus line 204 of FIG. 2. The source of the SF 3FET 319 is connected to the column output bus via the interconnection line 316, i.e., the output column bus line 203 of FIG. 2.

The reset diode includes a semi-conductive layer 309 plugged in a hole opened in the dielectric layers 313 and 314 to be connected to the FD node 303. The semi-conductive layer 309 may be formed by an epitaxially grown p-type silicon, a p-type doped poly-silicon, an amorphous silicon, or any other suitable semiconductor material. The top of the p-type semi-conductive layer 309 has a p+ type doped region 310 in it to make certain that a good Ohmic contact to the metal interconnection layer 311 is obtained.

Although the reset diode is vertically formed by the contact of the semi-conductive layer via the opened hole in the above embodiment, the reset diode may be implemented in many other manners. For example, a junction diode that is formed by an impurity implantation or diffusion, or a schottky barrier diode that is formed by metal-silicon interface can constitute the reset diode. In addition, the type of components can be changed according to embodiments of the present invention. For example, although the pixel in the embodiment described in FIG. 4 includes the p-type substrate, an n-type substrate can be used if the type of corresponding components is changed accordingly. That is, the pixel of the present invention can include an n-channel JFET fabricated in the n-type substrate. For the sake of the convenience, each description in detail is omitted.

Many other details and feature that are typically used in the construction of the modern pixel, such as the various other insulating and metal layers, color filter layers, and micro-lenses are well known to those skilled in the art but were for simplicity omitted from the drawing. The drawing is not to scale so the relative thicknesses and the pixel size may not truly represent the real pixel dimensions.

Figure 4:
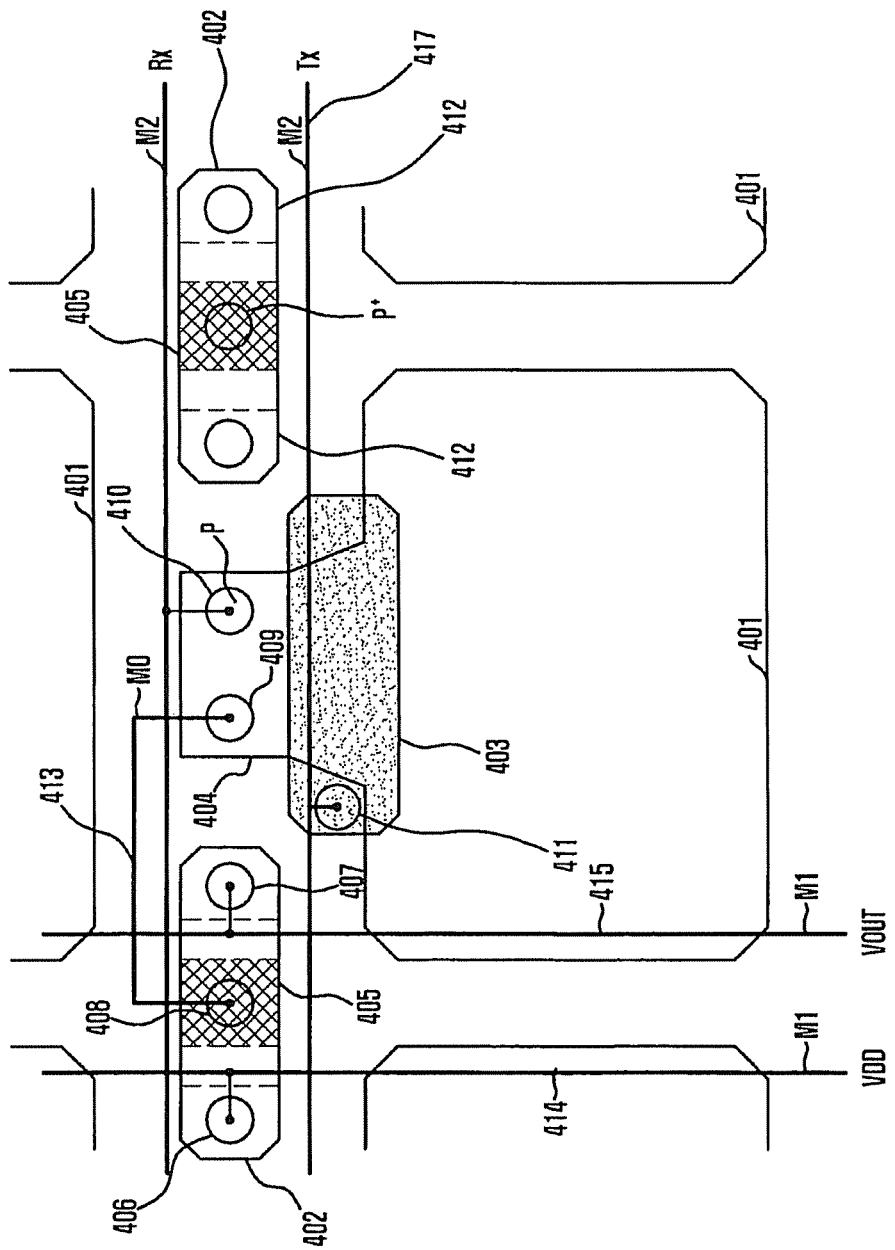
FIG. 4 is a layout illustrating the 2T CMOS sensor pixel of FIG. 2 in accordance with an embodiment of the present invention. (It is not to scale and does not show all the physical features of the structure such as, for example, the metal interconnection layers that are indicated only schematically by lines.)

For the convenience of understanding the present invention, one possible embodiment of the layout of the pixel of FIG. 2 is shown in FIG. 4, which includes active region 401 and 402. A first active region 401 represents the active region of the STI technology that contains a pinned photo-diode area, a transfer gate area 403 and a FD area 404. A second active region 402 separated from the first active region 401 by the STI isolation contains a SF JFET formed by a P+ gate region 405 and N+ source and drain regions 412.

The contact to the source region of the SF JFET is provided through a contact hole 407 and to the drain region through a contact hole 406. The p-type reset diode 209 of FIG. 2 is formed in a contact hole 410. The connection to the gate region 403 of the charge transfer transistor provided through a contact hole 411 and to the gate region 405 of the SF JFET through a contact hole 408.

The metal interconnections that complete the circuit are shown, for simplicity in this drawing only schematically. The gate region 405 of the SF JFET is connected to the FD area 404 via the contact hole 409 therein by an interconnection line 413, which is only local to the pixel and is formed by a special metal level called M0. The bias VDD is provided to the pixel by an interconnection line 414, which is common to all the pixels in a column and is formed by a metal level M1. Similarly an interconnection line 415 for the pixel output connects all the pixels in one column together and is also formed by the metal level M1. A metal level M2 is used for an interconnection line 416, i.e., a row line, connecting the reset diode to the reset control signal bus. The metal level M2 is also used for an interconnection line 417, i.e., another row line, that controls all the charge transfer gates in a given array row.

Other pixel features, for example the color filter and lens boundaries are for simplicity omitted form the drawing. This pixel layout needs not to share any circuitry with the neighboring pixels in order to enhance its performance. From the description of this layout embodiment it is clear that the pixel with the reset diode and the JFET can have a very compact layout that significantly enhances its performance.

Having thus described the preferred embodiments of a CMOS image sensor pixel of the present invention which has only one MOS transistor, one JFET and one p-n reset diode, which is intended to be illustrative and not limiting; it is noted that persons skilled in the art can make modifications and variations in light of the above teachings. It is therefore to be understood that changes may be made in the particular embodiments of the invention disclosed, which are within the scope and spirit of the invention as defined in the accompanying claims.

In accordance with the present invention the reset transistor is eliminated from the pixel together with the addressing transistor and it is replaced with a diode. The diode can be built with a very small size and placed vertically above the silicon substrate using poly-silicon, amorphous silicon, or epitaxially grown silicon plugs. This further minimizes the pixel area that is normally occupied by the addressing and resetting transistors. In addition the SF MOS transistor is replaced by a JFET for low noise operation with minimum 1/f and RTS noise. Using this concept it is possible to maintain the minimum pixel wiring and thus significantly improve performance of the small pixels over the existing state of the art. By optimizing the pixel layout with the vertically built reset diode and SF 3FET it is possible to obtain significant improvements in Quantum Efficiency and maximum charge storage capacity. This in turn improves the pixel sensitivity, Dynamic Range (DR), and Signal to Noise Ratio (SNR).

Although preferred embodiments of the present invention have been disclosed for illustrative purposes, those skilled in the art will appreciate that various modifications, additions and substitutions are possible, without departing from the scope and spirit of the invention as defined in the accompanying claims.

The invention claimed is:

1. A method for driving a pixel of an image sensor, wherein the pixel includes a source follower JFET configured to receive a signal from a floating diffusion node, the method comprising:
    addressing the pixel to readout the signal during a readout sequence, wherein the readout sequence includes a reset operation to charge the floating diffusion node to a reset voltage and a transfer operation to charge the floating diffusion node to a pixel voltage corresponding to a photo-generated charge;
    directing the pixel to a non-readout state at a time after completion of the readout sequence; and
    providing a predetermined set voltage on the floating diffusion node when the pixel is in the non-readout state;
    wherein the predetermined set voltage has a magnitude sufficient to forward bias a p-n junction between a gate and drain of the source follower JFET, but insufficient to drive the source follower JFET to an active readout state, and wherein the forward bias of the p-n junction at the predetermined set voltage is sufficient to allow a small current to flow from the floating diffusion node through the p-n junction thereby inhibiting voltage drift of the floating diffusion node from the predetermined set voltage.

2. The method of claim 1, wherein said addressing the pixel to readout the signal comprises:
    providing a high-level reset voltage on the floating diffusion node during a reset of the pixel; and
    providing the photo-generated charge to the floating diffusion node.

3. The method of claim 2, wherein the pixel further comprises a reset diode operatively connected between a reset line and the floating diffusion node, and wherein the reset of the pixel comprises:
    switching a drain voltage on the source follower JFET from a low-level drain voltage to a high-level drain voltage; and
    providing the high-level reset voltage on the reset line, wherein the high-level reset voltage has a magnitude greater than the high-level drain voltage.

4. The method of claim 2, wherein the pixel further comprises a reset diode operatively connected between a reset line and the floating diffusion node, wherein said providing a set voltage on the floating diffusion node comprises switching a drain voltage on the source follower JFET from a high-level drain voltage to a low-level drain voltage and providing a mid-level reset voltage on the reset line, and wherein the mid-level reset voltage has a magnitude that is lower than the high-level reset voltage used to reset the pixel but high enough to drive the floating diffusion node to the set voltage.

5. The method of claim 4, wherein said providing a set voltage comprises providing the set voltage at a level corresponding to a voltage difference between the low-level drain voltage and the mid-level reset voltage.

6. The method of claim 2, wherein said providing the photo-generated charge to the floating diffusion node comprises activating a transfer transistor that is in electrical communication between a photodiode and the floating diffusion node.

7. The method of claim 4, wherein the forward biasing of the p-n junction results in a forward bias current that is comparable to a dark current of the reset diode.

8. A method for driving a pixel array, wherein the pixel array includes a plurality of pixels, each pixel having a JFET configured as a source follower for providing a respective pixel output signal and a reset diode operatively connected between a reset line and a floating diffusion node, the method comprising:
    switching a drain voltage to the JFET from a low-level drain voltage to a high-level drain voltage;
    switching a reset voltage on the reset line to a high-level reset voltage to reset the pixel;
    activating a transfer signal to transfer a photo-generated charge generated by the pixel to a gate of the JFET to thereby provide the respective pixel output signal; and
    switching the drain voltage from the high-level drain voltage to the low-level drain voltage and driving the reset voltage on the reset line to a mid-level reset voltage, wherein the mid-level reset voltage has a magnitude between the high-level reset voltage and a low-level reset voltage provided on the reset line to address the pixel, and wherein a difference in magnitude between the mid-level reset voltage and the low-level drain voltage forward biases a p-n junction between a gate and a drain of the JFET to a level that is insufficient to drive the JFET to an active state.

9. The method of claim 8, wherein said switching the drain voltage from the high-level drain voltage to the low-level drain voltage and driving the reset voltage on the reset line to the mid-level reset voltage comprises placing a set voltage on the floating diffusion node.

10. The method of claim 9, wherein said placing a set voltage on the floating diffusion node comprises setting the set signal voltage at a level corresponding to a voltage difference between the low-level drain voltage and the mid-level reset voltage.

11. The method of claim 8, wherein said activating a transfer signal comprises activating a transfer transistor that is in electrical communication between a photodiode and the floating diffusion node.

12. The method of claim 8, wherein the forward biasing of the p-n junction results in a forward bias current that is comparable to a dark current of the reset diode.

13. The method of claim 8, wherein said switching a drain voltage to the JFET from a low-level drain voltage to a high-level drain voltage comprises selectively switching a drain terminal of the JFET between a low-level drain bus and a high-level drain bus.

14. A method for driving a pixel array having a matrix of rows and columns, wherein each pixel in the pixel array includes a JFET configured as a source follower to receive a signal, corresponding to a photo-generated charge, from a floating diffusion node, and wherein each pixel in the pixel array further includes a reset diode operatively connected between a reset bus of the row to which the pixel belongs and the respective floating diffusion node, the method comprising:

providing a high-level reset voltage on the reset bus of a row of pixels that are to be read;
  providing a low-level reset voltage on the reset bus of the row of pixels that are to be read after the pixels of the row have been reset;
  providing the photo-generated charges to the respective floating diffusion nodes during readout of the row of pixels;
  maintaining reset buses of non-addressed rows of the pixel array at a mid-level reset voltage while pixels of the addressed row are read out, wherein the mid-level reset voltage has a magnitude between the high-level reset voltage and the low-level reset voltage; and
  providing a set voltage on each of the floating diffusion nodes of the row of pixels if the pixels of the row are not addressed, wherein the set voltage has a magnitude that forward biases a p-n junction between a gate and drain of the respective JFET, and wherein the magnitude of the set voltage is insufficient to drive the respective JFET to an active state.

15. The method of claim 14, wherein said providing a set voltage on each of the floating diffusion nodes comprises:
  switching a drain voltage on the respective JFET from a high-level drain voltage to a low-level drain voltage; and
  providing the mid-level reset voltage on the reset bus of the corresponding row of pixels.

16. The method of claim 15, further comprising providing the high-level reset voltage at a magnitude greater than the high-level drain voltage.

17. The method of claim 16, wherein said providing a set voltage on each of the floating diffusion nodes further comprises providing the set voltage at a level corresponding to a voltage difference between the low-level drain voltage and the mid-level reset voltage.

18. The method of claim 16, wherein said providing the photo-generated charges to the respective floating diffusion nodes during readout of the row of pixels comprises activating a transfer transistor for each of the pixels, wherein each transfer transistor is in electrical communication between a photodiode and the floating diffusion node of the respective pixel.

19. The method of claim 16, wherein the forward biasing of the p-n junction of the respective JFET results in a forward bias current that is comparable to a dark current of the reset diode of the pixel.

* * * * *